US009460854B2

(12) United States Patent
Park et al.

(10) Patent No.: US 9,460,854 B2
(45) Date of Patent: Oct. 4, 2016

(54) MULTILAYER CERAMIC ELECTRONIC COMPONENT WITH INTERPOSER SUBSTRATE HAVING DOUBLE-LAYERED RESIN/PLATING TERMINALS

(71) Applicant: SAMSUNG ELECTRO-MECHANICS CO., LTD., Suwon, Gyunggi-do (KR)

(72) Inventors: Sang Soo Park, Gyunggi-do (KR); Heung Kil Park, Gyunggi-do (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 292 days.

(21) Appl. No.: 14/171,289

(22) Filed: Feb. 3, 2014

(65) Prior Publication Data
US 2015/0122534 A1   May 7, 2015

(30) Foreign Application Priority Data

Nov. 5, 2013  (KR) .................. 10-2013-0133451

(51) Int. Cl.
*H01G 4/30* (2006.01)
*H05K 1/14* (2006.01)
*H01G 4/228* (2006.01)
*H01G 2/06* (2006.01)

(52) U.S. Cl.
CPC ............ *H01G 4/30* (2013.01); *H01G 2/065* (2013.01); *H01G 4/228* (2013.01); *H05K 1/141* (2013.01); *H05K 2201/049* (2013.01); *H05K 2201/10015* (2013.01); *H05K 2201/10378* (2013.01)

(58) Field of Classification Search
None
See application file for complete search history.

(56) References Cited

U.S. PATENT DOCUMENTS

| 4,845,452 A * | 7/1989 | Sasaki | H03H 1/00 333/185 |
| 6,011,683 A * | 1/2000 | Dat | H01G 4/306 361/306.1 |
| 6,191,933 B1 * | 2/2001 | Ishigaki | H01G 4/232 361/309 |
| 6,292,351 B1 * | 9/2001 | Ahiko | H01G 4/232 361/306.3 |

(Continued)

FOREIGN PATENT DOCUMENTS

| JP | 09-129777 A | 5/1997 |
| JP | 2004-134430 A | 4/2004 |

(Continued)

OTHER PUBLICATIONS

Korea Office Action issued in corresponding Korean Patent Application No. 10-2013-0133451 issued on Sep. 20, 2014.

*Primary Examiner* — Jeremy C Norris
*Assistant Examiner* — Muhammed Azam
(74) *Attorney, Agent, or Firm* — McDermott Will & Emery LLP

(57) ABSTRACT

A multilayer ceramic electronic component includes a multilayer ceramic capacitor and an interposer substrate. The multilayer ceramic capacitor includes first and second external electrodes formed of a conductive paste on both ends of a ceramic body. The interposer substrate is attached to a mounting surface of the multilayer ceramic capacitor and includes first and second connection terminals connected to the first and second external electrodes at both ends of an insulation substrate, respectively. The first and second connection terminals have a double-layer structure including first and second conductive resin layers and first and second plating layers formed on the first and second conductive resin layers.

14 Claims, 6 Drawing Sheets

(56) References Cited

U.S. PATENT DOCUMENTS

| | | | |
|---|---|---|---|
| 6,479,763 B1* | 11/2002 | Igaki | C09J 9/02 174/260 |
| 2004/0066589 A1 | 4/2004 | Togashi et al. | |
| 2004/0223290 A1* | 11/2004 | Sutardja | H01G 4/232 361/306.3 |
| 2007/0077685 A1* | 4/2007 | Noda | H01L 21/67092 438/107 |
| 2007/0096254 A1* | 5/2007 | Ritter | H01C 1/148 257/532 |
| 2007/0249161 A1* | 10/2007 | Nakaone | H01R 12/57 438/637 |
| 2010/0315789 A1* | 12/2010 | Sato | H01R 13/2414 361/729 |
| 2013/0033836 A1* | 2/2013 | Hattori | H01G 4/30 361/768 |
| 2013/0037911 A1 | 2/2013 | Hattori et al. | |
| 2013/0284507 A1* | 10/2013 | Hattori | H05K 1/18 174/260 |
| 2014/0085850 A1* | 3/2014 | Li | H05K 1/0231 361/773 |
| 2015/0041195 A1* | 2/2015 | Ahn | H01G 2/065 174/260 |
| 2015/0131252 A1* | 5/2015 | Park | H05K 1/181 361/782 |
| 2015/0131253 A1* | 5/2015 | Park | H01G 2/06 361/782 |
| 2016/0088733 A1* | 3/2016 | Lee | H05K 1/144 361/768 |
| 2016/0088735 A1* | 3/2016 | Park | H05K 1/181 361/782 |

FOREIGN PATENT DOCUMENTS

| | | |
|---|---|---|
| JP | 5012658 B2 | 8/2012 |
| KR | 10-2013-0018146 A | 2/2013 |

* cited by examiner

MULTILAYER CERAMIC ELECTRONIC COMPONENT WITH INTERPOSER SUBSTRATE HAVING DOUBLE-LAYERED RESIN/PLATING TERMINALS

CROSS-REFERENCE TO RELATED APPLICATION

This application claims the benefit of Korean Patent Application No. 10-2013-0133451 filed on Nov. 5, 2013, with the Korean Intellectual Property Office, the disclosure of which is incorporated herein by reference.

BACKGROUND

The present disclosure relates to a multilayer ceramic electronic component and a board having the same mounted thereon.

In multilayer chip electronic components, a multilayer ceramic capacitor is a chip type capacitor and may be installed in circuit boards of various electronic products including a display device such as a liquid crystal display (LCD), a plasma display panel (PDP), or the like, a computer, a personal digital assistant (PDA), a cellular phone, and the like, to be charged with or discharge electricity.

Since such a multilayer ceramic capacitor (MLCC) has advantages such as a small size, high capacitance, ease of mounting, or the like, such a multilayer ceramic capacitor may be used as a component in various electronic devices.

Multilayer ceramic capacitors may have a structure in which a plurality of dielectric layers are stacked and internal electrodes having different polarities are alternately interposed therebetween.

Since the dielectric layers have piezoelectric and electrostrictive properties, a piezoelectric phenomenon may occur and thus cause vibrations between the internal electrodes when AC or DC voltage is applied to the multilayer ceramic capacitor.

Such vibrations may be transferred to a printed circuit board having the multilayer ceramic capacitor mounted thereon through external electrodes of the multilayer ceramic capacitor, such that the overall printed circuit board becomes an acoustic reflective surface to generate a vibratory sound regarded as noise.

The vibratory sound may correspond to an audible frequency in a region of 20 to 20,000 Hz, which may cause listener discomfort and is referred to as acoustic noise.

Patent Document 1 discloses a capacitor having first and second terminal electrodes formed at both ends thereof, and a module substrate having the capacitor mounted thereon and including a first land to which the first terminal electrode is connected and a second land to which the second terminals electrode is connected.

RELATED ART DOCUMENT (Patent Document 1) Japanese Patent Publication No. 5012658

SUMMARY

An aspect of the present disclosure may provide a multilayer ceramic electronic component having reduced acoustic noise therein.

According to an aspect of the present disclosure, a multilayer ceramic electronic component may include: a multilayer ceramic capacitor including first and second external electrodes formed of a conductive paste on both ends of a ceramic body; and an interposer substrate attached to a mounting surface of the multilayer ceramic capacitor and including first and second connection terminals connected to the first and second external electrodes at both ends of an insulation substrate, respectively, the first and second connection terminals having a double-layer structure including first and second conductive resin layers and first and second plating layers formed on the first and second conductive resin layers.

According to an aspect of the present disclosure, a board having a multilayer ceramic electronic component mounted thereon may include: a circuit board having first and second electrode pads thereon; and a multilayer ceramic electronic component mounted on the circuit board, the multilayer ceramic electronic component including: a multilayer ceramic capacitor including first and second external electrodes formed of a conductive paste on both ends of a ceramic body; and an interposer substrate attached to a mounting surface of the multilayer ceramic capacitor and including first and second connection terminals connected to the first and second external electrodes at both ends of an insulation substrate, respectively, the first and second connection terminals having a double-layer structure including first and second conductive resin layers and first and second plating layers formed on the first and second conductive resin layers, and the first and second connection terminals being mounted on the first and second electrode pads, respectively.

The first and second external electrodes of the multilayer ceramic capacitor and the first and second connection terminals of the interposer substrate may have first and second conductive adhesive layers interposed therebetween, respectively.

The interposer substrate may be formed to have an area smaller than that of the mounting surface of the multilayer ceramic capacitor.

The first and second external electrodes of the multilayer ceramic capacitor may extend from both end surfaces of the ceramic body to portions of both main surfaces and both side surfaces of the ceramic body.

The first and second connection terminals of the interposer substrate may cover the entirety of the ends of the insulation substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
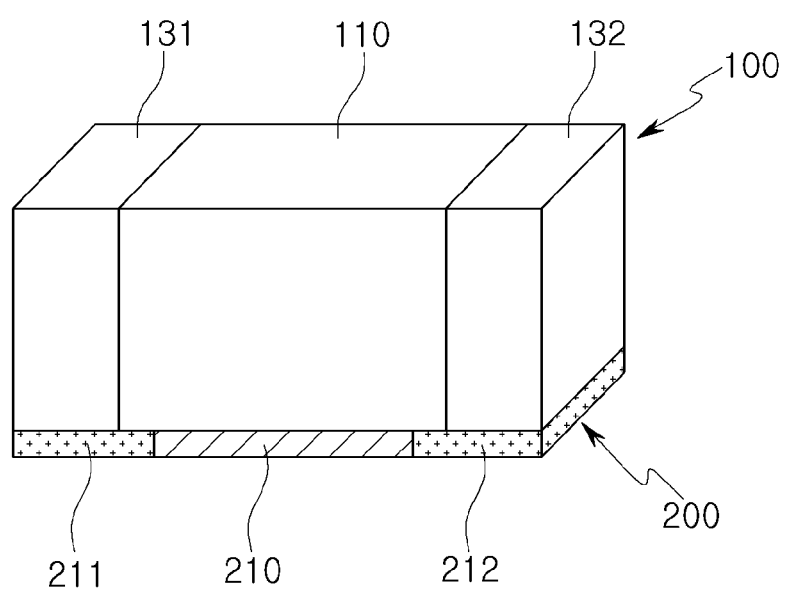
FIG. 1 is a perspective view of a multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 3:
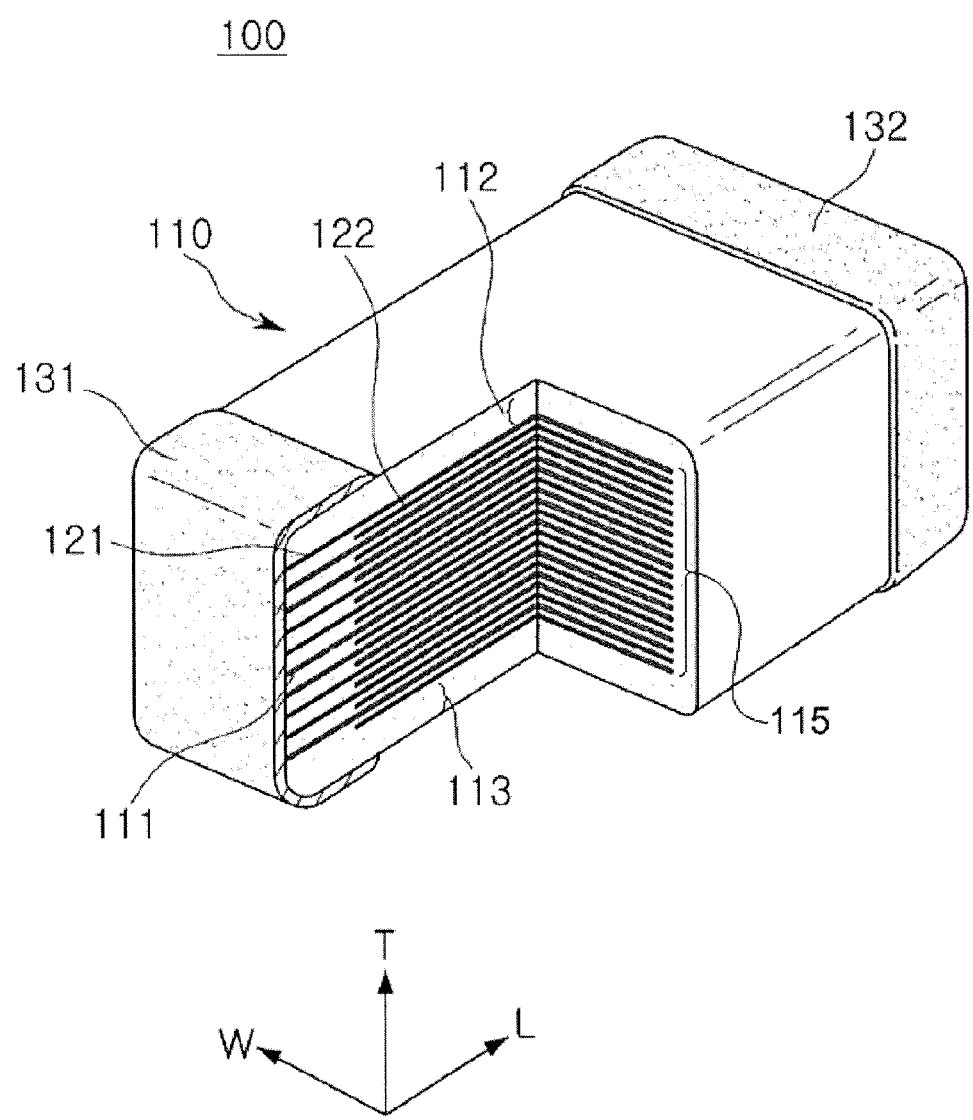
FIG. 3 is a partially cut-away perspective view of the multilayer ceramic capacitor of the multilayer ceramic electronic component shown in FIG. 1.

In order to clearly describe exemplary embodiments of the present disclosure, L, W and T shown in FIG. 3 indicate a length direction, a width direction, and a thickness direction of a hexahedron, respectively. Here, the thickness direction may be used to have the same concept as a direction in which dielectric layers are stacked.

In addition, according to exemplary embodiments, for the convenience of explanation, two surfaces of a ceramic body opposing each other in the thickness direction are referred to as upper and lower surfaces, two surfaces thereof opposing each other in the length direction are referred to as end surfaces, and two surfaces thereof perpendicular to the surfaces and opposing each other in the width direction are referred to as side surfaces. Here, the lower surface is also referred to as a mounting surface.

Multilayer Ceramic Electronic Component

Figure 2:
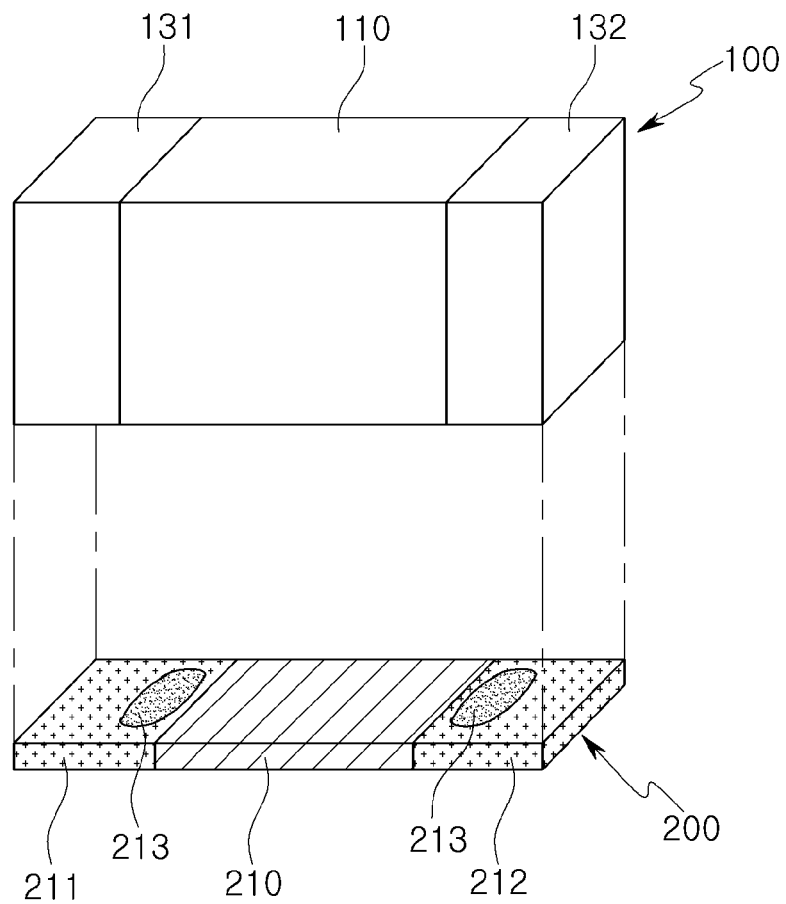
FIG. 2 is an exploded perspective view illustrating a state in which the multilayer ceramic electronic component shown in FIG. 1 is divided into a multilayer ceramic capacitor and an interposer substrate.

FIG. 1 is a perspective view of a multilayer ceramic electronic component according to an exemplary embodiment of the present disclosure. FIG. 2 is an exploded perspective view illustrating a state in which the multilayer ceramic electronic component shown in FIG. 1 is divided into a multilayer ceramic capacitor and an interposer substrate.

Referring to FIGS. 1 and 2, a multilayer ceramic electronic component according to an exemplary embodiment of the present disclosure may include a multilayer ceramic capacitor 100 and an interposer substrate 200.

Herein, the interposer substrate refers to a sheet shaped or plate shaped member enabling a fan-out or pad pitch expansion. That is, the interposer substrate refers to a substrate for converting a pitch of an electrode terminal used when an electronic component is mounted on a circuit board. Due to the interposer substrate, the electronic component and the circuit board are electrically connected to each other.

The multilayer ceramic capacitor 100 may include a ceramic body 110, and first and second external electrodes 131 and 132 formed of a conductive paste on ends of the ceramic body 110.

Further, the interposer substrate 200 may be attached to the lower surface of the multilayer ceramic capacitor 100, i.e., the mounting surface thereof and may include an insulation substrate 210 and first and second connection terminals provided on ends of the insulation substrate 210 and having the first and second external electrodes 131 and 132 to be mounted thereon.

On the first and second connection terminals of the interposer substrate 200, first and second conductive adhesive layers 213 may be provided in such a manner that they come in contact with mounting surfaces of the first and second external electrodes 131 and 132, respectively, to be attached thereto. Accordingly, the multilayer ceramic capacitor 100 may be mechanically connected to the interposer substrate 200 while being electrically connected thereto by the first and second conductive adhesive layers 213.

The interposer substrate 200 may serve to reduce acoustic noise occurring in a circuit board by relieving stress or vibrations due to piezoelectric properties of the multilayer ceramic capacitor 100 with elastic force of the insulation substrate 210.

FIG. 3 is a partially cut-away perspective view of the multilayer ceramic capacitor of the multilayer ceramic electronic component shown in FIG. 1.

Referring to FIG. 3, the multilayer ceramic capacitor 100 according to the exemplary embodiment may include the ceramic body 110, an active layer 115 having first and second internal electrodes 121 and 122 therein, upper and lower cover layers 112 and 113, and the first and second external electrodes 131 and 132 formed on the ends of the ceramic body 110, respectively.

The ceramic body 110 may be formed by stacking a plurality of dielectric layers 111 and then sintering the same. The shape and dimensions of the ceramic body 110 and the number of the stacked dielectric layers 111 are not limited to those illustrated in the exemplary embodiment.

The plurality of dielectric layers 111 forming the ceramic body 110 may be in a sintered state, such that boundaries between the dielectric layers 111 adjacent to each other are not readily apparent without a scanning electron microscope (SEM).

The ceramic body 110 may include the active layer 115 contributing to capacitance formation of the capacitor, and the upper and lower cover layers 112 and 113 formed on upper and lower portions of the active layer 115, respectively, as upper and lower margin portions.

The active layer 115 may be formed by alternately stacking the first and second internal electrodes 121 and 122 with the respective dielectric layers 111 interposed therebetween.

The thickness of the dielectric layers 111 may be altered depending on a capacitance design of the multilayer ceramic capacitor 100, and the thickness of a single dielectric layer may be, but is not limited to, 0.01 μm to 1.00 μm after sintering.

Further, the dielectric layers 111 may include a ceramic powder having high dielectric permittivity, e.g., a barium titanate ($BaTiO_3$) based powder or a strontium titanate ($SrTiO_3$) based powder, but are not limited thereto.

The upper and lower cover layers 112 and 113 may be formed of the same material and may have the same configuration as those of the dielectric layers 111, except that they include no internal electrode.

The upper and lower cover layers 112 and 113 may be formed by using a single dielectric layer or by stacking two or more dielectric layers on upper and lower surfaces of the active layer 115, respectively. Basically, the upper and lower cover layers 112 and 113 may serve to prevent damage to the first and second internal electrodes 121 and 122 caused by physical or chemical stress.

The first and second internal electrodes 121 and 122 having opposite polarities may be formed by printing a conductive paste including a conductive metal on the respective dielectric layers 111 at a predetermined thickness. The first and second internal electrodes 121 and 122 may be alternately exposed to both end surfaces of the ceramic body in the stacking direction, and they may be electrically insulated from each other due to the interposed dielectric layer 111.

The first and second internal electrodes 121 and 122 may be electrically connected to the first and second external electrodes 131 and 132, respectively, through portions thereof alternately exposed to the end surfaces of the ceramic body 110.

Accordingly, when voltage is applied to the first and second external electrodes 131 and 132, charges are accumulated between the first and second internal electrodes 121 and 122 facing each other, and the capacitance of the multilayer ceramic capacitor 100 is proportional to an area of an overlapping region between the first and second internal electrodes 121 and 122 in the active layer 115.

The thickness of the first and second internal electrodes 121 and 122 may be determined depending on the intended usage of the capacitor, and may be, but is not limited to, from 0.2 μm to 1.0 μm, taking into account the dimensions of the ceramic body 110.

The conductive metal contained in the conductive paste forming the first and second internal electrodes 121 and 122 may be, but is not limited to, nickel (Ni), copper (Cu), palladium (Pd) or an alloy thereof.

The printing method of the conductive paste may include, but is not limited to, a screen printing or gravure printing method.

The first and second external electrodes 131 and 132 may be formed of a conductive paste containing a conductive metal, and the conductive metal may be nickel (Ni), copper (Cu), palladium (Pd), gold (Au) or an alloy thereof but is not limited thereto.

Here, the first and second external electrodes 131 and 132 do not form a plating layer and are formed by applying a conductive paste containing glass onto the ceramic body 110 and then sintering the same.

The first and second external electrodes 131 and 132 may be formed to extend from both end surfaces of the ceramic body 110 to portions of both main surfaces and both side surfaces of the ceramic body 110 to thereby cover the both ends of the ceramic body 110. The first and second external electrodes 131 and 132 may absorb external mechanical stress and the like, whereby they may serve to prevent damage such as cracks to the ceramic body 110 and to the first and second internal electrodes 121 and 122.

Interposer Substrate

Figure 4A:
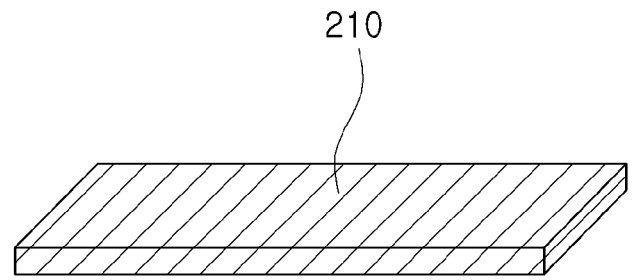
FIGS. 4A through 4C are perspective views illustrating a process of manufacturing the interposer substrate of the multilayer ceramic electronic component shown in FIG. 1.
Figure 4B:
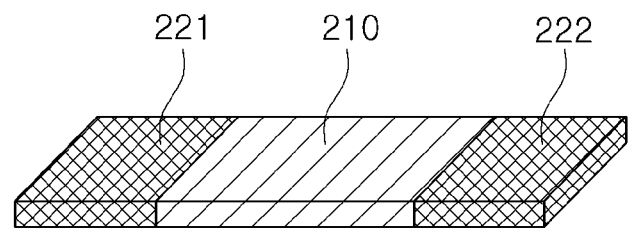
Figure 4C:
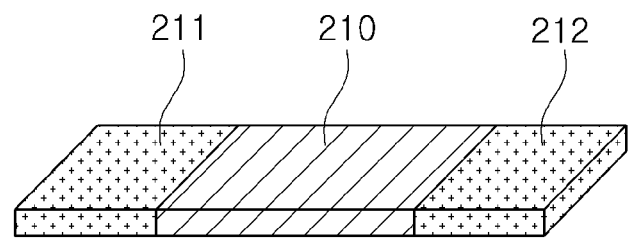

FIGS. 4A through 4C are perspective views illustrating a process of manufacturing the interposer substrate of the multilayer ceramic electronic component shown in FIG. 1.

In the process of manufacturing the interposer substrate 200 included in the multilayer ceramic electronic component, the insulation substrate 210 may first be cut into a predetermined size.

Then, a conductive resin paste may be applied to both ends of the insulation substrate 210 to form first and second conductive resin layers 221 and 222. The conductive resin paste may be constituted of a conductive metal and a thermosetting resin.

Then, nickel-plating and tinning are performed on the first and second conductive resin layers 221 and 222, to form first and second plating layers 211 and 212.

The interposer substrate 200 may be attached to the lower surface of the multilayer ceramic capacitor 100, i.e., the mounting surface thereof and may include the insulation substrate 210 and first and second connection terminals provided on ends of the insulation substrate 210 and having the first and second external electrodes 131 and 132 mounted thereon.

Referring to FIGS. 4A through 4C, the first and second connection terminals may have a double-layer structure including first and second conductive resin layers 221 and 222 and first and second plating layers 211 and 212 formed to cover the first and second conductive resin layers 221 and 222, respectively, on the insulation substrate 210.

Here, the first and second conductive resin layers 221 and 222 and the first and second plating layers 211 and 212 may be formed to cover both ends of the insulation substrate 210, and consequently, the first and second connection terminals cover the entirety of the both ends of the insulation substrate 210.

In addition, the first and second plating layers 211 and 212 may include a nickel (Ni) plating layer first formed and a tin (Sn) plating layer formed on the nickel (Ni) plating layer.

When the interposer substrate 200 thus configured is mounted on a circuit board, the multilayer ceramic capacitor 100 attached to the interposer substrate 200 may have the first and second external electrodes 131 and 132 with non-plated surfaces. Thus, even in a case in which an excessive amount of solder is used at the time of mounting the capacitor on the circuit board, the transfer of the solder along the first and second external electrodes 131 and 132 of the multilayer ceramic capacitor 100 may be prevented. Accordingly, the piezoelectric stress is prevented from being directly transferred from the multilayer ceramic capacitor 100 to the circuit board via the first and second external electrodes 131 and 132 thereof, such that acoustic noise may be further reduced.

Modified Example

Figure 5:
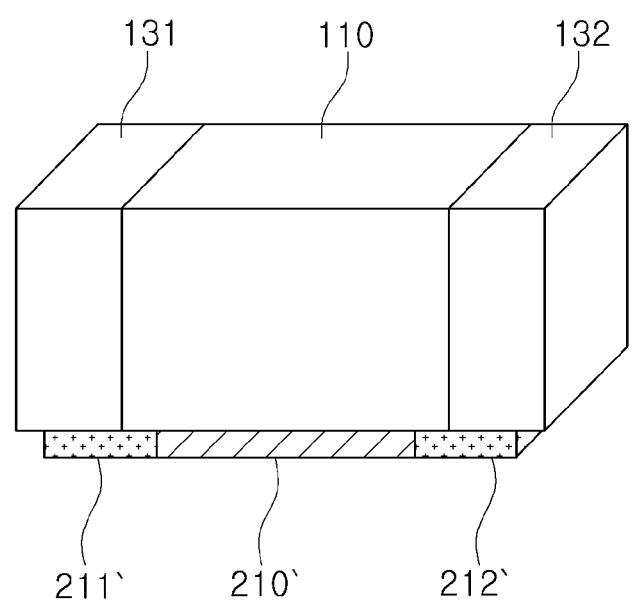
FIG. 5 is a perspective view of a multilayer ceramic electronic component according to another exemplary embodiment of the present disclosure.

FIG. 5 is a perspective view of a multilayer ceramic electronic component according to another exemplary embodiment of the present disclosure.

Referring to FIG. 5, an interposer substrate may have an area smaller than that of a mounting surface of the multilayer ceramic capacitor 100. The first and second connection terminals have a double-layer structure including first and second conductive resin layers first formed and first and second plating layers formed on the first and second conductive resin layers as described above, and thus detailed descriptions thereof will not be repeated.

That is, the area of an insulation substrate 210' configuring the interposer substrate is smaller than that of the mounting surface of the multilayer ceramic capacitor 100, the first and second connection terminals formed on both ends of the insulation substrate 210' may also be smaller than those in the previous exemplary embodiment. Reference numerals 211' and 212' indicate first and second plating layers smaller than those in the previous exemplary embodiment.

As such, the area of the interposer substrate is smaller than that of the mounting surface of the multilayer ceramic capacitor 100, so that an area to which stress transferred from the multilayer ceramic capacitor 100 to the insulation substrate 210 and to the circuit board is applied may be reduced, thereby further reducing a magnitude of acoustic noise.

Board Having Multilayer Ceramic Electronic Component Mounted Thereon

Figure 6:
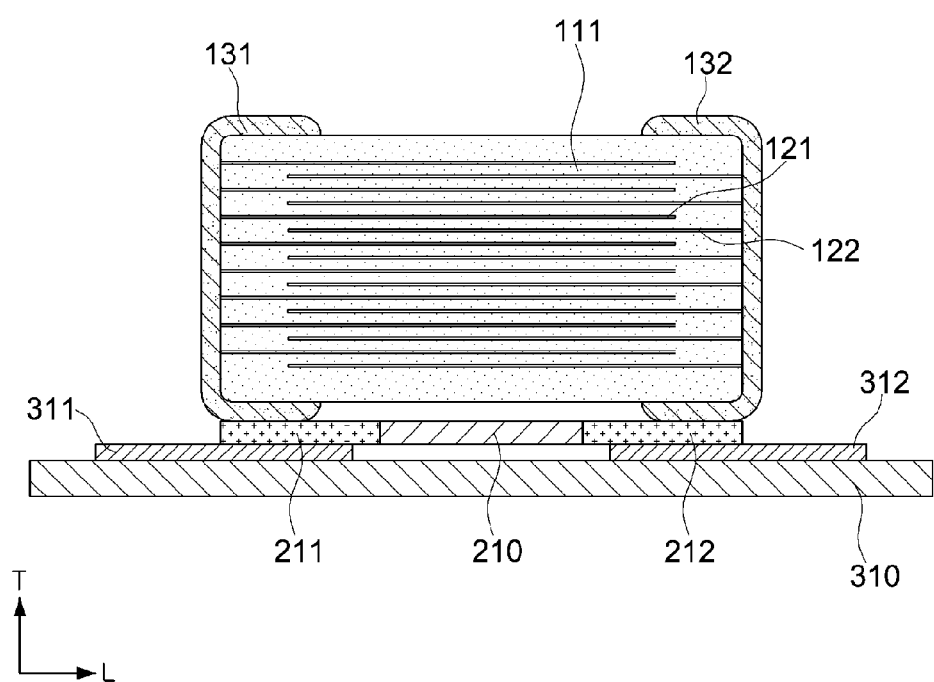
FIG. 6 is a cross-sectional view of the multilayer ceramic electronic component shown in FIG. 1 when being mounted on a circuit board, taken along a length direction of the multilayer ceramic electronic component.

FIG. 6 is a cross-sectional view of the multilayer ceramic electronic component shown in FIG. 1 when being mounted on a circuit board, taken along a length direction of the multilayer ceramic electronic component.

Referring to FIG. 6, a board having a multilayer ceramic electronic component mounted thereon according to an exemplary embodiment may include a circuit board 310 on which the multilayer ceramic electronic component is horizontally mounted, and first and second electrode pads 311 and 312 formed on an upper surface of the circuit board 310 and spaced apart from each other.

Here, the multilayer ceramic electronic component may be electrically connected to the circuit board 310 while the interposer substrate 200 is disposed below the multilayer ceramic capacitor 100 and the first and second connection terminals are positioned on and in contact with the first and second electrode pads 311 and 312, respectively.

If voltage is applied to the multilayer ceramic electronic component while the multilayer ceramic electronic component is mounted on the circuit board 310, acoustic noise may be generated.

The amount of the solder connecting the first and second external electrodes 131 and 132 of the multilayer ceramic capacitor 100, the first and second connection terminals of the interposer substrate 200, and the first and second electrode pads 311 and 312 to one another, may be determined based on a size of the first and second electrode pads 311 and 312. Depending on the amount of solder, the magnitude of acoustic noise may be adjusted.

Table 1 below shows results obtained by comparing degrees of acoustic noise in circuit boards of Comparative Examples in which respective multilayer ceramic capacitors were attached to a circuit board with solder according to the related art, with those of Inventive Examples in which an interposer substrate according to an exemplary embodiment of the present disclosure is employed.

TABLE 1

|  |  | Acoustic Noise (dB) |
|---|---|---|
| Comparative Example | 1 | 21 |
|  | 2 | 24 |
|  | 3 | 17 |
| Inventive Example | 4 | 15 |
|  | 5 | 15 |
|  | 6 | 16 |

The acoustic noise shown in Table 1 were measured at DC 4V, AC 1V with the frequency of 3 KHz.

As can be seen from Table 1, in the case of sample 1 to 3, Comparative Examples in which the respective multilayer ceramic capacitors were attached to the circuit board with solder according to the related art, acoustic noise was 21 dB, 24 dB and 17 dB, respectively, and exhibited large deviation therebetween.

However, in Inventive Examples 4 to 6, acoustic noise was 15 dB, 15 dB and 16 dB, respectively, below 20 dB. Accordingly, it could be seen that acoustic noise was lower in Inventive Examples than in Comparative Examples, and deviation therebetween was small.

As set forth above, according to exemplary embodiments of the present disclosure, stress or vibrations due to piezoelectric properties of the multilayer ceramic capacitor may be alleviated by elastic force of the interposer substrate, such that the magnitude of acoustic noise occurring in the circuit board may be reduced.

Further, in the multilayer ceramic capacitor, surfaces of the first and second external electrodes may not be plated. Thus, even in a case in which an excessive amount of solder is used at the time of mounting the capacitor on the circuit board, the transfer of the solder along the external electrodes of the multilayer ceramic capacitor may be prevented. Accordingly, the piezoelectric stress may be prevented from being directly transferred from the multilayer ceramic capacitor to the circuit board via the external electrodes thereof, such that acoustic noise may be further reduced.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component, comprising:
   a multilayer ceramic capacitor including first and second external electrodes formed of a conductive paste on both ends of a ceramic body; and
   an interposer substrate attached to a mounting surface of the multilayer ceramic capacitor and including first and second connection terminals connected to the first and second external electrodes at both ends of an insulation substrate, respectively, the first and second connection terminals having a double-layer structure including first and second conductive resin layers and first and second plating layers disposed on the first and second conductive resin layers,
   wherein the first and second connection terminals are spaced apart from each other and surround both end portions of the insulation substrate.

2. The multilayer ceramic electronic component of claim 1, wherein the first and second external electrodes of the multilayer ceramic capacitor and the first and second connection terminals of the interposer substrate have first and second conductive adhesive layers interposed therebetween, respectively.

3. The multilayer ceramic electronic component of claim 1, wherein the interposer substrate is formed to have an area smaller than that of the mounting surface of the multilayer ceramic capacitor.

4. The multilayer ceramic electronic component of claim 1, wherein the first and second external electrodes of the multilayer ceramic capacitor extend from both end surfaces of the ceramic body to portions of both main surfaces and both side surfaces of the ceramic body.

5. The multilayer ceramic electronic component of claim 1, wherein the first and second connection terminals of the interposer substrate cover the entirety of the ends of the insulation substrate.

6. A board having a multilayer ceramic electronic component mounted thereon, the board comprising:
   a circuit board having first and second electrode pads thereon; and
   a multilayer ceramic electronic component mounted on the circuit board, the multilayer ceramic electronic component including: a multilayer ceramic capacitor including first and second external electrodes formed of a conductive paste on both ends of a ceramic body; and an interposer substrate attached to a mounting surface of the multilayer ceramic capacitor and including first and second connection terminals connected to the first and second external electrodes at both ends of an insulation substrate, respectively, the first and second connection terminals having a double-layer structure including first and second conductive resin layers and first and second plating layers disposed on the first and second conductive resin layers, and the first and second connection terminals being mounted on the first and second electrode pads, respectively, wherein the first and second connection terminals are spaced apart from each other and surround both end portions of the insulation substrate.

7. The board of claim 6, wherein in the multilayer ceramic electronic component, the first and second external electrodes of the multilayer ceramic capacitor and the first and second connection terminals of the interposer substrate have first and second conductive adhesive layers interposed therebetween, respectively.

8. The board of claim 6, wherein in the multilayer ceramic electronic component, the interposer substrate is formed to have an area smaller than that of the mounting surface of the multilayer ceramic capacitor.

9. The board of claim 6, wherein in the multilayer ceramic electronic component, the first and second external electrodes of the multilayer ceramic capacitor extend from both end surfaces of the ceramic body to portions of both main surfaces and both side surfaces of the ceramic body.

10. The board of claim 6, wherein the first and second connection terminals of the interposer substrate cover the entirety of the ends of the insulation substrate.

11. The multilayer ceramic electronic component of claim 1, wherein the first and second plating layers are disposed on the first and second conductive resin layers to cover an upper surface and side surfaces of each of the first and second conductive resin layers.

12. The multilayer ceramic electronic component of claim 1, wherein each of the first and second conductive resin layers is disposed on an upper surface and a plurality of side surfaces of the insulation substrate, and each of the first and second plating layers is disposed on an upper surface and a plurality of side surfaces of the first and second conductive resin layers.

13. The board of claim 6, wherein the first and second plating layers are disposed on the first and second conductive resin layers to cover an upper surface and side surfaces of each of the first and second conductive resin layers.

14. The board of claim 6, wherein each of the first and second conductive resin layers is disposed on an upper surface and a plurality of side surfaces of the insulation substrate, and each of the first and second plating layers is disposed on an upper surface and a plurality of side surfaces of the first and second conductive resin layers.

* * * * *